(12) United States Patent
Grunwald

(10) Patent No.: US 6,524,490 B1
(45) Date of Patent: Feb. 25, 2003

(54) METHOD FOR ELECTROLESS COPPER DEPOSITION USING A HYPOPHOSPHITE REDUCING AGENT

(75) Inventor: John Grunwald, Ramat-Gan (IL)

(73) Assignee: J. G. Systems Inc., Miami, FL (US)

( * ) Notice: Subject to any disclaimer, the term of this patent is extended or adjusted under 35 U.S.C. 154(b) by 184 days.

(21) Appl. No.: 09/704,821

(22) Filed: Nov. 3, 2000

(30) Foreign Application Priority Data

Oct. 2, 2000 (IL) ................................. 138811

(51) Int. Cl.⁷ .............................. C23C 18/00
(52) U.S. Cl. .............. 216/18; 216/13; 427/98; 427/337
(58) Field of Search ............... 427/98, 337; 216/13, 216/17, 18; 438/678

(56) References Cited

U.S. PATENT DOCUMENTS

| | | | | |
|---|---|---|---|---|
| 3,962,494 A | * | 6/1976 | Nuzzi | 106/1.11 |
| 4,265,943 A | | 5/1981 | Goldstein | |
| 4,279,948 A | | 7/1981 | Kukanskis | |
| 4,970,107 A | * | 11/1990 | Akahoshi et al. | 156/60 |
| 4,997,516 A | * | 3/1991 | Adler | 216/101 |
| 5,275,861 A | * | 1/1994 | Vaughn | 174/36 |

* cited by examiner

*Primary Examiner*—Thi Dang
(74) *Attorney, Agent, or Firm*—Edward Langer, Pat. Atty.

(57) ABSTRACT

A method for improving the electrical conductivity and appearance of copper films produced by reduction of copper ions using hypophosphite, comprising exposure of the as-deposited copper film to a solution of dimethylamino borane (DMAB) or equivalents thereof.

16 Claims, No Drawings

METHOD FOR ELECTROLESS COPPER DEPOSITION USING A HYPOPHOSPHITE REDUCING AGENT

FIELD OF THE INVENTION

The invention relates to an improved method of electroless copper deposition using a hypophosphite reducing agent in general, and more specifically to a method of increasing the electrical conductivity of copper films deposited using a hypophosphite reducing agent.

BACKGROUND OF THE INVENTION

U.S. Pat. Nos. 4,265,943 and 4,279,948, the teachings each of which are incorporated by reference herein in their entirety, teach methods of producing through hole plated printed circuit boards by reduction of copper ions in aqueous solution, via hypophosphite. This method would be desirable to use in place of the conventional methods that use a formaldehyde, a suspected carcinogen. However, copper deposits obtained by the above-referenced patents, tend to be dark and have low electrical conductivity, which leads to difficulty in subsequent electrolytic plating. It is surmised that the dark, poorly conductive copper films produced by the above-mentioned prior art are caused by the presence of cuprous oxide in the film. Indeed, the literature and prior 0art indicate that hypophosphite favors reduction of $Cu^{++}$ to $Cu^+$. Cuprous oxides are known to be poor conductors of electricity, which limits the ease of operation and usefulness of the as-deposited copper films for mass production of plated through hole circuit board.

It would be desirable to provide a method for depositing copper, which avoids the use of formaldehyde by using the hypophosphite method and produces a conductive copper film with reduced cuprous oxide.

SUMMARY OF THE INVENTION

Accordingly, it is a broad object of the present invention to overcome the problems of the prior art and provide a method for electroless copper deposition using a hypophosphite reducing agent with improved properties.

In accordance with a preferred embodiment of the invention there is provided a method of depositing copper on a substrate using an electroless copper deposition solution comprising copper ions and hypophosphite, such method comprising:

a. depositing a coating of copper on the substrate using the electroless deposition solution; and b. exposing said coating to a solution of a borane reducing compound. The substrates usually are comprised of through holes and are made of copper-clad laminates of insulating organic polymers such as epoxy, polyimide or others.

It was surprisingly found that by exposing the as-deposited dark, brown copper film to an aqueous solution of dimethylamino borane (DMAB), it changes to a substantially pink, metallic coppery appearance of greatly improved electrical conductivity. It is believed that the DMAB reduces the cuprous oxides in the film to the desirable metallic copper, with its improved electrical conductivity. Thus, the present invention finally enables, on a wider scale, the practice of the above-referenced patents, issued almost two decades ago, and the inventive method is designed to eliminate the use of the nefarious formaldehyde, a suspected carcinogen.

It is understood that while DMAB is the preferred embodiment of this invention, other reducers such as borohydrides, other alpha amine boranes and the like, can be conducive to essentially the same desired effects that result from the use of aqueous solutions of DMAB. In fact, chemical reducing agents capable of reducing $Cu^+$ to $Cu^°$ are within the teachings of this patent.

The concentration and temperature of the aqueous DMAB solution used in the method of the invention can vary within broad ranges. Additives that enhance the reducing action of, and stabilize DMAB solutions are practicable, too.

Furthermore, while aqueous DMAB solutions are ecologically preferred, non-aqueous solutions of DMAB, borohydrides or alike are within the teachings of this invention. The exposure of the as-deposited copper-bearing film to the DMAB solution should be done with aggressive solution, or work movement. It greatly speeds up the reaction of the film with the DMAB.

This improved method is particularly useful in the production of PCB's. Usually PCB laminates are made of a copper cladding which is separated by an insulating polymer such as glass-epoxy, polyimide, teflon and others. In the production of PCB's, holes are formed in the laminate, and the insulating wall surfaces of those holes are pre-treated to make them receptive to plating. Plating is accomplished using the hypophosphite reducing agent method. The resulting poorly conductive copper plating is then dipped in a borane reducing agent, preferably DMAB. Following the DMAB bath the poorly conductive copper is reduced to a higher quality metal copper that has improved conductivity. Thus, further plating of the PCB can proceed effectively.

The PCBs produced by the method of the invention can consist of plated through holes which either penetrate all the way from one side of the board to the other (hereinafter referred to as "through holes"), or only partially penetrate the board (also referred to as "blind vias"). Of course, the plated PCBs can be a combination of both through holes and blind vias. For the sake of simplicity, the term hole, in this specification and the claims that follow, is understood to encompass both through holes and blind vias.

DETAILED DESCRIPTION OF THE INVENTION

The present invention provides a method of depositing copper on a substrate comprising the steps of first using a hypophosphite reducing agent to deposit a copper film, followed by exposing the copper film to an amino borane reducing agent, preferably DMAB. The hypophosphite reducing agent provides a copper deposit with a low conductivity, due to the presence of cuprous oxide. The amino borane bath further reduces the copper and provides a copper metal with higher conductivity.

Additionally, the present invention teaches a method of making a printed circuit board, comprising the steps:

a) forming holes in a substrate, said holes having walls with an insulating surface;

b) catalyzing said insulating wall surfaces to be receptive to electroless copper deposition;

c) plating said substrate and said insulating wall surface with electroless copper to form a coating on said substrate; and d) exposing said coating to a solution of a borane reducing compound.

e) selectively applying a plating resist to said substrate;

f) plating electrolytic copper to the desired thickness;

g) plating an etch resist;

h) stripping said plating resist; and i) etching copper from areas unprotected by said etch resist.

Preferably, the borane reducing solution in step d) is a DMAB solution.

In the above method several variations may be carried out, for example: step d) is followed by an optional step of electrolytically plating copper, step b) is preceded by a cleaning and microetching step, steps c) and d) are done either with mechanical solution agitation or with work agitation.

The plating resist used in step e) above is preferably a dry film.

The PCBs formed by the method of the invention constitute another aspect of the invention The PCBs are preferably of a multilayer type.

As mentioned earlier, while this invention principally deals with through hole plated circuit boards wherein holes are punched or drilled all the way through the dielectric, it may also be useful in a new generation of PCBs wherein interconnecting holes only partially penetrate the dielectric. Such interconnecting holes are known as "blind vias", and their copper coverage is especially challenging because of their very small diameter and also in view of problems known as "outgassing" due to the holes being blocked at one side of the panel or dielectric construction The invention is now illustrated by the following non-limiting examples:

EXAMPLE 1

3" by 3" copper-clad epoxy panels from which the copper has been etched away were cleaned, conditioned, catalyzed, accelerated, and electrolessly copper-plated from a complexed copper solution via hypophosphite reduction, following the teachings and examples of U.S. Pat. No. 4,279,948. Electroless deposition time was approximately 20 min.

Following an acid dip, the hypophosphite-reduced electroless copper-bearing coating was electroplated in several commercial acid copper electroplating baths, at current densities ranging from 2 to 8 A/dm$^2$ and for about 10 min.

Electrolytic copper coverage was very slow, and essentially limited to areas adjacent to the cathode rack contacts. The rest of the panel showed a powdery, smutty deposit, known in the trade as burnt copper, unsuitable for quality circuitry.

EXAMPLE 2

Example #1 was repeated, except that the as-plated copper-bearing electroless deposit was immersed for one to four min. in an aqueous 6 g/l DMAB solution, at a temp. of 60° C., with vigorous work agitation.

The panel was then electroplated in the same electroplating baths and at the same current densities as in Example 1.

Electrolytic copper coverage was significantly faster, with complete coverage obtained in less than 1 min.

These results indicate greatly improved electrical conductivity, as a result of exposure to the DMAB solution While the invention is principally directed to an improved method for manufacturing printed circuits, it will generally and broadly find applications wherever improved electrical conductivity of electroless copper deposits is beneficial. Some such uses include electromagnetic shielding, antistatic treatments of textiles, semiconductors and interconnect products and electronic devices in general.

I claim:

1. A method of depositing copper on a substrate using an electroless copper deposition solution comprising copper ions and hypophosphite, such method comprising:
   a. depositing a coating of copper on the substrate using the electroless deposition solution; and
   b. exposing said coating to a solution of a borane reducing compound.

2. A method according to claim 1 wherein said borane reducing solution is a dimethylamino borane solution.

3. A method according to claim 1 wherein said substrate comprises holes.

4. A method according to claim 1 wherein the substrate is a polymeric textile.

5. A method according to claim 1 wherein the substrate is silica.

6. A method according to claim 1 wherein the substrate has no holes.

7. A method according to claim 1 for use in electromagnetic shielding.

8. A method of making a printed circuit board, comprising the following steps:
   a) forming holes in a substrate, said holes having walls with an insulating surface;
   b) catalyzing said insulating wall surfaces to be receptive to electroless copper deposition;
   c) plating said substrate and said insulating wall surface with electroless copper to form a coating on said substrate;
   d) exposing said coating to a solution of a borane reducing compound.
   e) selectively applying a plating resist to said substrate;
   f) plating electrolytic copper to the desired thickness;
   g) plating an etch resist;
   h) stripping said plating resist; and
   i) etching copper from areas unprotected by said etch resist.

9. A method according to claim 4 wherein the borane reducing solution in step d) is a DMAB solution.

10. A method of making a printed circuit board according to claim 8, further comprising, between step d) and step e), the step of electrolytically plating copper onto said substrate.

11. A method according to claim 8 wherein step b) is preceded by the steps of cleaning, conditioning and microetching.

12. A method according to claim 8 wherein the printed circuit board is of a multilayer type.

13. A method according to claim 8 wherein steps c) and d) are done with agitation.

14. A method according to claim 8 wherein the temperature of said solution used in step d) is between 15° and boiling temperature.

15. A method according to claim 8 wherein said electroless copper in step c) uses a hypophosphite reducer.

16. A method according to claim 8 wherein said substrate is made of a copper-clad laminate or an insulating organic polymer.

* * * * *